United States Patent
Huff (10) Patent No.: US 11,990,344 B2
(45) Date of Patent: May 21, 2024

(54) LOW-COST METHOD OF MAKING A HARD MASK FOR HIGH RESOLUTION AND LOW DIMENSIONAL VARIATIONS FOR THE FABRICATION AND MANUFACTURING OF MICRO- AND NANO-DEVICES AND -SYSTEMS

(71) Applicant: CORPORATION FOR NATIONAL RESEARCH INITIATIVES, Reston, VA (US)

(72) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 277 days.

(21) Appl. No.: 17/485,993

(22) Filed: Sep. 27, 2021

(65) Prior Publication Data

US 2023/0102861 A1 Mar. 30, 2023

(51) Int. Cl.
*H01L 21/3065* (2006.01)
*H01L 21/02* (2006.01)
*H01L 21/027* (2006.01)
*H01L 21/308* (2006.01)

(52) U.S. Cl.
CPC ...... *H01L 21/3065* (2013.01); *H01L 21/0206* (2013.01); *H01L 21/02178* (2013.01); *H01L 21/0274* (2013.01); *H01L 21/3081* (2013.01)

(58) Field of Classification Search
CPC ............. H01L 21/0272; H01L 21/0273; H01L 21/0331; H01L 21/0332; H01L 21/0334; H01L 21/0335; H01L 21/0337; H01L 21/3065–30655; H01L 2224/0347–0348; H01L 2224/1147–1148; H01L 2224/2747–2748; H01L 21/7813; H01L 21/027–0338; H01L 21/32; H01L 21/0271–0279; H01L 21/312–3128; H01L 21/02178; H10K 71/221; G03F 7/004–115; G03F 7/12; G03F 7/16–18; G03F 7/20–24; G03F 7/70–70991; G03F 7/26–428

See application file for complete search history.

(56) References Cited

U.S. PATENT DOCUMENTS

2017/0175258 A1* 6/2017 Robinson ............. C23C 16/305
2021/0296127 A1* 9/2021 Park .................... H01L 21/0332

* cited by examiner

*Primary Examiner* — Julio J Maldonado
*Assistant Examiner* — Stanetta D Isaac
(74) *Attorney, Agent, or Firm* — Nixon & Vanderhye, P.C.

(57) ABSTRACT

A method for depositing, patterning and removing a layer of aluminum oxide as a masking material layer for performing a deep, high-aspect ratio etches into a substrate. The method comprising deposing a photoresist onto the substrate, performing lithography processing on the photoresist, developing the photoresist to pattern the photoresist into a mask design, depositing a thin-film layer of aluminum oxide; immersing the substrate into a solution to lift-off the aluminum oxide in regions where the aluminum oxide is deposited on top of the photoresist thereby leaving the patterned aluminum oxide layer on the substrate where no photoresist was present, performing deep reactive ion etching on the substrate wherein the hard masking material layer composed of aluminum oxide functions as a protective masking layer on the substrate to prevent etching from occurring where the aluminum oxide is present, and removing the aluminum oxide masking layer by immersion in a solution.

15 Claims, 6 Drawing Sheets

Deposition of Aluminum Oxide Layer

LOW-COST METHOD OF MAKING A HARD MASK FOR HIGH RESOLUTION AND LOW DIMENSIONAL VARIATIONS FOR THE FABRICATION AND MANUFACTURING OF MICRO- AND NANO-DEVICES AND -SYSTEMS

FIELD OF INVENTION

The present disclosure is directed to a method of making hard masks that enable high-resolutions to be made into material layers. This method has application in the fabrication and manufacturing of devices and/or systems that are made using semiconductor-based manufacturing methods for the implementation of micro- and nano-devices and systems.

BACKGROUND OF THE INVENTION

A critical element in micro- and nano-scale fabrication and manufacturing methods is the use of masking layers for the purpose of patterning of material layers as part of the implementation of micro- and nano-devices and systems.

Herein fabrication is defined as initial prototyping of devices and systems and manufacturing is the production of devices and systems for commercial and/or Governmental purposes (including military).

Masking layers are material layers that are deposited and patterned having the desired pattern(s) including the shapes, geometries and dimensions of the device features, and are used to transfer the desired mask design pattern(s) into one or more materials underneath the masking layer. The materials underneath the masking layer can be thin-film material layers, thick-film material layers, as well as the substrate. The use of masking layers is an important part of process sequences for the implementation of devices and systems; wherein a process sequence is the sequentially performed ordered array of processing steps that are used to fabricate or manufacture functional micro- and nano-devices and systems.

SUMMARY OF INVENTION

Examples of the present technology are directed to a method of making hard masks that enable high-resolution accurate and precision features to be made into material layers. This method has application in the fabrication and manufacturing of devices and/or systems that are made using semiconductor-based manufacturing methods for the implementation of micro- and nano-devices and systems. It is especially useful for making highly-accurate dimensional features for deep, high-aspect ratio etches into many different material layer types and substrates.

DETAILED DESCRIPTION OF THE INVENTION

FIGS. 1a-1f illustrate the conventional use of a masking layer 103 for the pattern transfer to an underlying material layer 102 in a standard semiconductor-based manufacturing process 100. This sequence of processing steps could be used for the implementation of many types of microsystems, such as integrated circuits (ICs), micro-electro-mechanical systems (MEMS), photonics, vacuum electronics, etc. and also could be used to implement many types of nanosystems, such as quantum devices, nano-electro-mechanical systems (NEMS), etc. FIGS. 1a-1f illustrate the substrate in cross section at various stages in the process.

Figures 1A, 1C:
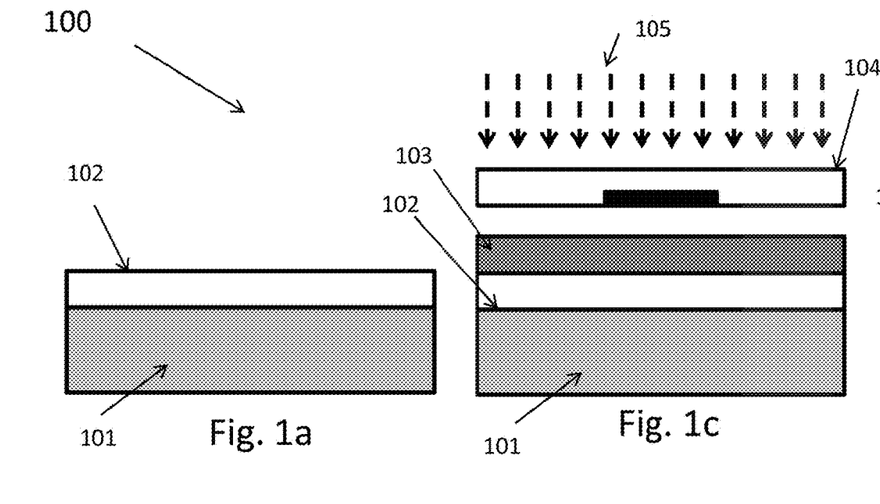
FIGS. 1a-1f illustrate use of a masking layer for the pattern transfer to an underlying material layer in a standard semiconductor-based manufacturing process.

In FIG. 1a, a material layer 102 that was deposited onto a substrate 101 is shown. This material layer 102 is to be patterned as a part of a fabrication process sequence.

Figure 1B:
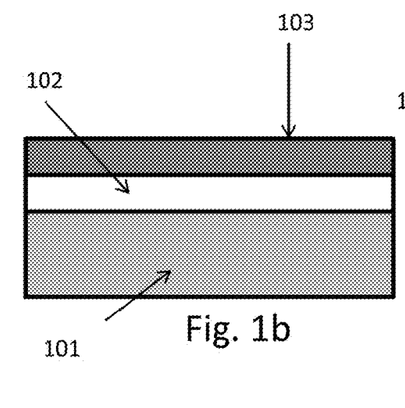

In FIG. 1b, a layer of a photosensitive material (e.g., a photoresist layer 103), called a photoresist is deposited onto the surface of the material layer 102 on the substrate 101. A photolithographic processing step is performed in FIG. 1c wherein a mask plate 104 with the desired pattern to be transferred to the photoresist layer 103 is placed into close proximity to the photoresist layer 103 on the top of the material layer 102 on the substrate 101. An exposure source (not shown) that emits optical radiation 105 (exposure radiation) at a specific wavelength that the photoresist layer 103 is sensitive to is allowed to illuminate the photoresist layer 103 through the mask plate 104.

The mask plate 104 has transparent and non-transparent regions across the mask plate 104 surface that represents the mask design to be transferred to the material layer 102. Certain regions of the mask plate 104 are transparent and allow the optical radiation 105 to be exposed through the mask plate 104 to impinge upon the photoresist layer 103, while other regions of the mask plate 104 are non-transparent and block the optical radiation 105 from propagating though the mask plate 104 and impinging upon the photoresist layer 102. Since the photoresist layer 103 is a photosensitive material, some areas of the photoresist layer 103 will be exposed to optical radiation 105 and others will not be exposed to the optical radiation 105. Thus, the pattern from the mask plate 104 is transferred into the photoresist layer 103.

Figure 1D:
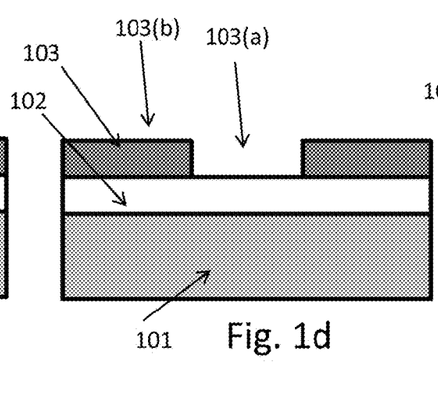

Subsequent to the optical exposure 105 exposure, the photoresist layer 103 is developed using a developer solution (not shown in FIG. 1(d)) that removes the unexposed regions of the photoresist layer 106 and leaves in place the areas exposed in the photoresist layer 103 as shown in FIG. 1d. This would be the case for a positive polarity photoresist layer 103. Alternatively, the lithography could be performed using a photoresist layer 103 that is a negative polarity photoresist wherein the exposed regions of the photoresist layer 103 are removed and the unexposed regions of the photoresist layer 103 are left in place. It should be understood that either type of polarity of photoresist layer 103 can be used in the present invention.

After development, the patterned layer of photoresist layer 103 is shown in FIG. 1(d) with areas where the photoresist was removed 103(a) and areas of photoresist 103(b) left in place. The substrate 101 with the developed photoresist layer 103 is then usually hard baked to drive off the solvents and harden the photoresist layer 103 left on the surface of the material layer 102 so that the photoresist layer 103 is better able to withstand the subsequent processing steps that it will undergo to pattern the underlying material layer 102. Importantly, the photoresist layer 103 acts as a protective layer on the surface of the material layer 102 (which may be a thin-film layer) on the substrate 101. The exposed areas of the thin-film material layer 102 without photoresist layer 106 can be readily removed using appropriate means well known in the art, such as etching. And the areas of the material layer 102 protected by the photoresist layer 103 will not be removed.

Figure 1E:
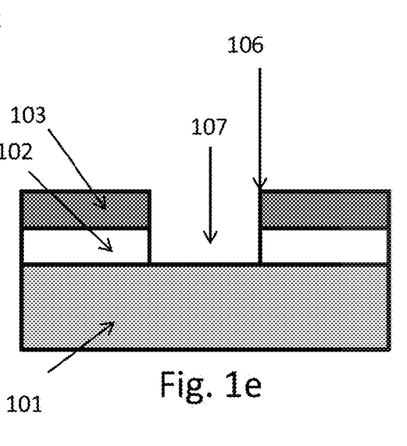

The patterning of the underlying material layer 102 on the substrate 101 is shown in FIG. 1e. As can be seen the photoresist 103 acts as a masking layer to enable the transfer the pattern of desired dimensions of the open areas 106 of the design into the underlying material layer 102. Most commonly, the underlying material layer 102 is patterned to replicate the mask design in the photoresist layer 103 using an etching process. Etching of the material layer 102 can be done using a variety of techniques such as the immersion of the substrate 101 into a reactive ion plasma etcher, which is well known in the art.

Figure 1F:
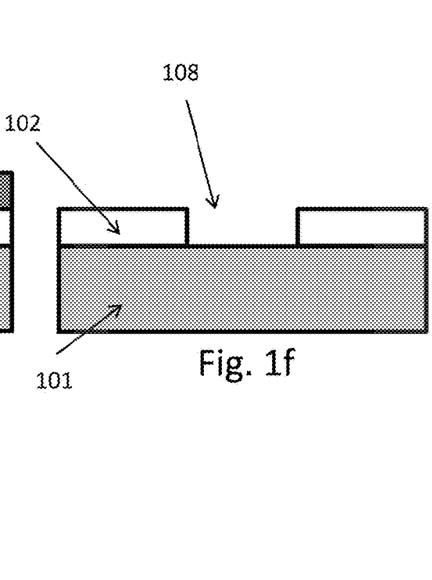

After the underlying material layer 102 has been patterned using etching, the masking layer of photoresist layer 103 is typically removed from the substrate 101 since its purpose has been satisfied as shown in FIG. 1f. Subsequently, the process sequence will continue with other processing steps involved in the fabrication or manufacturing of the micro- or nano-devices and/or systems.

The process outlined in FIGS. 1a-1f would be an example of a positive photoresist layer 103. There are also photoresists having negative polarity wherein the exposed regions are removed in development and the unexposed regions remain in development.

Importantly, while the process steps outlined in FIGS. 1a-1f involve a direct transfer of the mask pattern to the photoresist layer 103 on the substrate 101, another method called projection photolithography could also be used wherein the image transfer or projected onto the photoresist represents a reduction of the features on the mask.

Additionally, there are other lithographic methods that involve the direct writing of the mask pattern onto the photoresist without the use of a mask plate. For example, one method involves a laser at an appropriate wavelength that the photoresist is sensitive to that is raster scanned over the substrate under direct control of a computer that controls the laser writing such that the laser essentially writes the mask pattern onto the photoresist.

Most process sequences for semiconductor-based fabrication and manufacturing involve a number of lithographic processing steps to pattern a number of material layers and other material property alterations. It should be noted that while photolithography is the most commonly used method of transferring patterns into photoresist masking layers, there are also methods of directly writing the patterns into the photoresist, such as direct-write laser exposure, e-beam lithography, and others. In short, there are a number of methods of performing the process method outlined in FIGS. 1a-1f.

Essentially, the photolithographic process entails the transfer of the patterns on a mask plate 104 into the photoresist masking layer 103 that is subsequently used to pattern the one or more underlying material layers 102. It can also be used to transfer the pattern into the underlying substrate 101.

It should also be noted that while most micro- and nano-scale fabrication methods involve the use of semiconductor substrates, such as silicon, silicon-carbide, and others, that some micro- and nano-scale fabrication uses other material systems for the substrates including plastics, metals, ceramics, etc.

Traditionally, masking layers have been made of photoresist materials 103 as shown in FIG. 1. Photoresists are polymer-based materials. There are a number of photoresists types that are available commercially and with different attributes, such as the polarity (positive or negative); wavelength of the radiation that the photoresist is sensitive to; thickness levels; uniformity levels; etc.

The reason for the use of a photoresist is to create a pattern of features of the correct geometries and sizes that are to be transferred into the underlying material layer(s) as illustrated in FIGS. 1a-1f. In most cases, the underlying material layer is etched using what are called either a "wet" or "dry" etching method. Wet etching is not commonly used in micro- and nanofabrication since this type of etch is mostly isotropic. That is, the etch rate is equal or nearly equal in all directions. This results in undercutting of the masking layer and therefore loss of accurate control of the dimensions of the features that are being etched.

More common for pattern transfer to the underlying material layer is the use of "dry" plasma-based etching methods. There are a number of dry etchants, but the ones that are most commonly used in practice are reactive-ion etching (RIE), inductively-coupled plasma (ICP), electron cyclotron resonance (ECR) etching, and deep, reactive ion etching (DRIE). Each of these methods uses a plasma to create chemical species that are reactive with the material to be etched and also involve bombardment of ions from the plasma. Both are important for the etch process. The ion bombardment applies mechanical energy to the material surface being etched that aids in breaking chemical bonds and the chemically reactive species react with the surface atoms and then desorb from the surface as reaction by-products. These type of etch processes are well known in the art.

The major reason that these dry plasma etching methods are often used is that they provide very anisotropic etching. That is, the etching proceeds into the material layer downward from the edge of the masking layer. There is little to no lateral etching or undercutting of the mask. Therefore, the etched feature has the same shape and dimensions as those of the mask design. This is usually very desirable in fabrication and manufacturing.

One consequence of these plasma-based dry etching technologies is that the impinging chemical species and the mechanical energy of the bombarding ions used as an important component in the etching process also results in the erosion of the masking layer. The amount of erosion of the masking layer depends on a number of factors, including: what the masking layer material is made from; the chemistry of the process gases; the energies of the ions bombarding the masking layer during the etch process; and the sputter yields of the masking layer material.

One of the most important attributes of a photoresist mask is its resistance to the etching process relative to the material that is being etched. This is termed "mask selectivity" in the art and is well known. The selectivity of the mask used for an etching or patterning process is defined as the ratio of the removal rate of the material that is being etched, relative to the removal rate of the masking material layer.

A higher mask selectivity is desired since it enables the mask to be more robust and sustainable in performing its function of protecting the portions of the underlying material layer(s) that are not to be etched.

Mask selectivity becomes increasing important as the depth of the intended etch increases since the mask must retain its viability for a longer etch time and longer exposure to the bombarding ions and reaction with the chemical species of the etch plasma.

Moreover, it is common for deep, high-aspect ratio etches to exhibit a decreasing etch rate as the depth of the etch increases due to factors such as the inability of reactive species and ions to reach the bottoms of deep, high-aspect ration features, and the inability for reaction byproducts to escape from the deep, high-aspect ratio etched features. That is, the etch rate of the material layer being etched tends to decrease as the depth of the etch increases. This is particularly true for high-aspect ratio etches. Aspect ratio is defined as the ratio of the depth of the etch to the width of the feature being etched and is well known in the art.

Mask selectivity is especially important for deep, high-aspect ratio etching (DRIE) that is increasingly common in integrated circuit through-wafer-vias, integrated circuit through-substrate-vias (TSV), MEMS, microsystems, 3-D integration technologies and many others. Mask selectivity is also important in other types of plasma etches, including ICP, ECR, and others.

Mask selectivity is also important for deep etches into other material types, such as silica, glass, quartz, fused silica, fused quartz, silicon carbide, gallium nitride, indium phosphide, as well as any known semiconductor material, whether crystalline or not, any ceramic material, whether crystalline of not, and any metal or plastic materials.

Many of the uses of deep etches involve the etching or patterning a sizable portion of the thickness of the substrate, or even completely through the thickness of the substrate. The thickness of a standard substrate in semiconductor manufacturing varies between about 500 microns to nearly 1 millimeter depending on the diameter of the substrate. Sometimes the substrates can be made several millimeters in thickness and the etch can be performed through the entire substrate thickness or a sizable portion thereof.

Also the thickness of material layers to be etched on the surfaces of substrates can vary in thickness as well from tens of microns to hundreds of microns.

Additionally, it is sometimes desirable to directly bond two or more substrates together to create a composite bonded substrate composed of two or more substrates with an overall thickness being a multiple of 500 microns to several millimeters in total thickness depending on the diameter of the substrates. Therefore, these bonded composite substrates can be much thicker than a single substrate.

Further, for these bonded substrate systems, it may be desirable and useful to etch a sizable portion of the thickness of the composite bonded substrates, or even completely through the thickness of the composite bonded substrates.

The wafer or substrate materials may include: silicon; silicon carbide; gallium nitride; indium phosphide; gallium arsenide; or any type of semiconductor material whether crystalline or not. It could also include various forms of polymers, ceramics (whether crystalline or not), and metals as well.

Another important issue regarding masking layers and mask selectivity is the required thickness of the masking layer. The thickness of the masking layer is related to the ability to accurately pattern the masking layer so that it has the most accurate and precise representation of the desired patterns, including shapes, geometries and dimensions, to be transferred to the masking layer and subsequently to the underlying material layer(s) to be etched or patterned.

If the mask selectivity of a masking layer material is high than for a given depth of etch, the masking layer thickness can be made thinner. Conversely, for a given depth of etch, if the masking layer does not have a high selectivity then a thicker masking layer would be required.

Importantly, a masking layer that is thinner can be patterned with higher accuracy and precision than if the masking layer is thicker using the standard fabrication techniques that are available. For example, thicker layers of photoresist have more diffraction effects at the corners of the mask than thinner photoresist layers when the exposure of the photoresist is conducted during photolithography.

Therefore, it is desirable that the mask selectivity of the masking layer material be a high as possible since enables the pattern(s) from the masks to be more accurately and precisely transferred into the materials layer(s) or substrate (s) to be etched.

Indeed, there are a number of important considerations involving the selection of masking layers. First, it must be able to be patterned into the shapes, geometries and dimensions with a high level of accuracy and precision. Second, it must have a good adhesion to the surface(s) that it is meant to protect. Third, the patterning of the mask should be a relatively simple process that does not damage or alter other materials or devices on the substrate. Fourth, it must have a high selectivity with respect to the material(s) to be etched. Fifth, it must be able to be removed easily and without damaging or altering any of the materials or devices on the substrate after its purpose has been completed.

While the use of photoresist material layers as masking layers has been very common in micro- and nano-device and systems fabrication and manufacturing for many years, since photoresist is made of a polymer material it has limited ability to withstand long and/or aggressive etching or patterning processes and this is well known in the art. Particularly, if the etch to be performed is a deep and/or high-aspect ratio etch that requires a longer period of time and more exposure to chemical attack and ion bombardment from the plasma of the etching process since the photoresist layer would have to be unreasonably thick with the associated resultant degradation of the accuracy and precision of the dimensions and geometries that are being etched.

As a result, material layer(s) that are more robust when exposed to etching or patterning processes have been used as the masking material layers for etching processes. If these material layers are not polymers, then they are often called "hard masks." These are well known in the art.

Hard masks are routinely used in the fabrication and manufacturing of micro- and nano-devices and systems. Hard masks are most commonly used as a protective layer for etching or patterning of a one or more material layers or material systems underlying the hard mask. Hard masks serve essentially the same purpose as photoresist, however, hard masks are more resistant to the etching and patterning processes that are used compared to photoresist.

Hard masks can be made of many types of materials, but most often are a deposited thin-film layer of silicon dioxide or metal, with aluminum being most common.

However, even the material types that are commonly used as hard masks can often not be very resistant to long reactive ion etches that are performed deep into the underlying material layers.

Further, these other materials for hard masks still often must be made relatively thick for deep etches. This reduces the accuracy and precision of the transfer of the mask design into the material to be etched. This is because the etching of any material layer is never perfectly anisotropic, meaning perfectly straight into the material being etched without any lateral etching. Therefore, if a material layer is used as a hard mask, it must first be patterned into the desired shapes and dimensions using some sort of patterning process such as etching, and if the masking material layer is thinner rather than thicker, the patterning of the masking material layer will more precisely and accurately represent the desired etch mask pattern.

Therefore, there is a need for a hard masking layer process that is more resistant to erosion that other materials for longer deep, high aspect ratio dry plasma etches.

There is also a need for hard masking layer that can be made very thin so that they can more accurately and precisely represent the mask layout design's features including shapes, geometries and dimensions.

Examples of the present technology are directed to a new material layer that can be used as a hard masking layer and a process for its use.

Examples of the present technology are directed to a method of making hard masks that enable high-resolution accurate and precision features to be made into material layers as well as substrates. This method has application in the fabrication and manufacturing of devices and/or systems that are made using semiconductor-based manufacturing methods for the implementation of micro- and nano-devices and systems.

The hard mask material is composed of a thin-film layer of aluminum oxide. Aluminum oxide is a chemical compound composed of the elements aluminum and oxygen. It is sometimes referred to as alumina. Although the stoichiometry of aluminum oxide is usually expressed as $Al_2O_3$, the ratios of aluminum to oxygen can vary somewhat and still be classified as aluminum oxide. This invention covers all useful stoichiometries of aluminum oxide. The reason for the varying stoichiometries is that the deposition methods can result in slight variations of the elemental proportions.

Aluminum oxide is a very hard material and considered as a refractory material due to its high melting point of 2072 C.

Aluminum oxide is extremely resistance to chemical attack and is also resistant to sputtering from ion bombardment unless the energy of the ions is sufficiently high. The energy threshold for ion sputtering of aluminum oxide is usually higher than the ion energies used in most reactive ion etch (RIE) processes. It should be noted that the term reactive ion etch (RIE) process is used as a descriptor for any etch process that uses reactive ions to etch materials including: RIE; dry plasma etching; inductively-coupled plasma (ICP) etch processes; deep reactive ion etch (DRIE) processes; electron cyclotron resonance (ECR) etching; and others.

Consequently, aluminum oxide is an extremely resistant material to RIE etching and therefore makes a good candidate as a hard masking material layer.

In fact, a very thin layer of aluminum oxide as a masking material layer can be used for very long and deep etches without the erosion of the masking layer. For example, a few tens of nanometers of aluminum oxide is sufficient for the DRIE etch completely through a silicon substrate. This represents a significant improvement over the most commonly used hard masking material layer for DRIE, that is, silicon dioxide.

Aluminum oxide is also difficult to etch or pattern. Therefore, a key element in this invention in addition to the use of aluminum oxide as a masking material layer is how to pattern the aluminum oxide into the desired hard mask pattern.

Another key element of the present invention is how to pattern the material with high fidelity, accurately and precision.

In one embodiment of the present invention the aluminum oxide hard mask material layer is patterned using a technique called "lift-off." The lift-off process is show in FIGS. 2a-2d for illustrative purposes. The substrate is shown in cross-sections at various stages of the lift-off process in FIGS. 2a-2d.

Figure 2A:
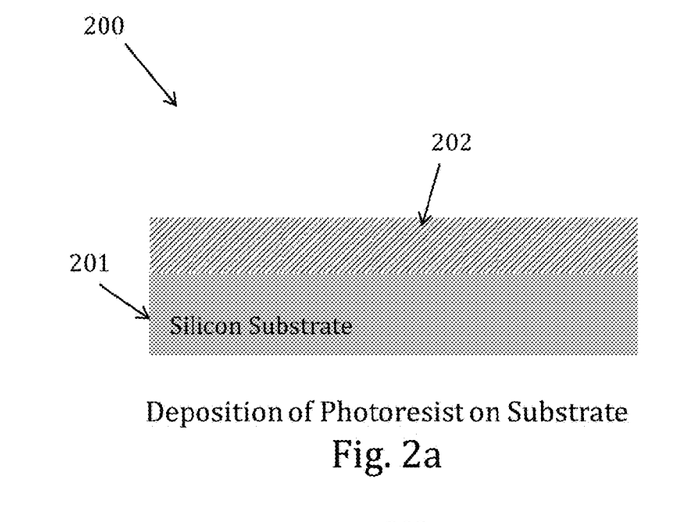
FIGS. 2a-2d illustrate cross-section views of a substrate at various stages of a lift-off process according to an example of the present technology.
Figure 2B:
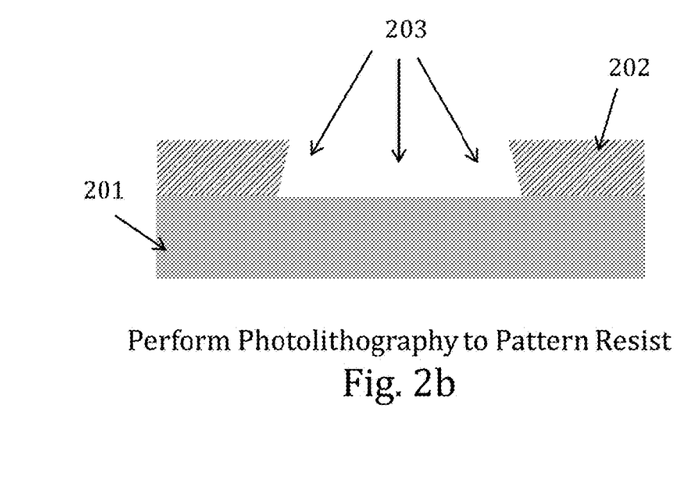

As shown in the process 200 of FIGS. 2a-2d, a layer of photoresist 202 is deposited onto the surface of the substrate 201. The photoresist 202 then undergoes a lithography processing step in order to transfer the mask design image into the photoresist 202 (the transfer of mask design images was described above). The lithography includes an exposure of the photoresist 202, that may or may not involve the alignment to previously made features on the substrate 201, and development of the photoresist 202 as shown in FIG. 2b. After exposure, the photoresist 202 is developed by immersion into a developer solution into the desired mask design pattern whereby certain regions of the photoresist 202 have areas on the substrate surface (e.g., areas 203 in FIG. 2b) have been completely cleared of the photoresist 202.

In order to facilitate the lift-off process the thickness of the photoresist 202 may be made thicker than the thin-film of aluminum oxide 204 to be deposited. Additionally, the photoresist 202 may also intentionally have a negatively-sloped or reentrant sidewall profile as shown in FIG. 2b that will also aid in the lift-off process.

A cleaning step may be performed after the photoresist 202 has been patterned and developed in order to clean the exposed areas 203 of the substrate 201 surface. The cleaning may be performed in order to improve the adhesion of the to-be-deposited thin-film layer of aluminum oxide 204. The cleaning is used to remove any residual photoresist or as well as any other potential residual chemical residues left in the areas mostly cleared of photoresist (areas 203 in FIG. 2b). The cleaning may be a short immersion in an appropriate solution that removes organics or a short exposure to an oxygen $O_2$ containing plasma. The cleaning method should be carefully selected so as not to degrade the patterned photoresist 202 on the substrate 201 surface.

Figure 2C:
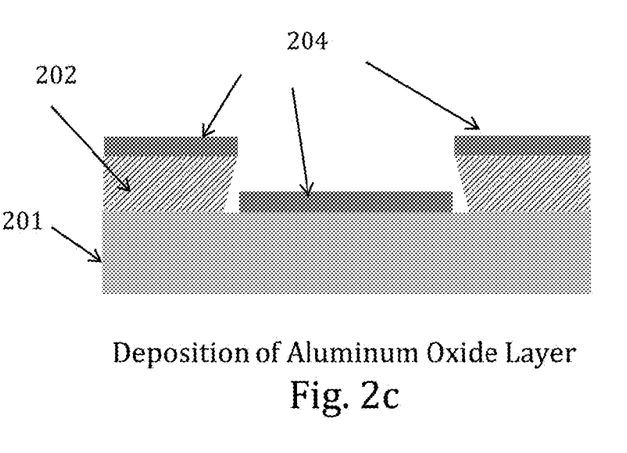

Next, as shown in FIG. 2c, the layer of aluminum oxide 204 is deposited using physical vapor deposition (PVD) methods. The PVD method used could be either sputtering or evaporation, or a combination of these two methods of PVD. Additionally, the PVD can be performed using what is known as reactive-deposition wherein aluminum is deposited using PVD in a chamber environment with oxygen and the aluminum species can react with the oxygen prior to landing on the substrate or in flight to the surface of the substrate 201 to form aluminum oxide 204. This can be done using either sputtering or evaporation methods.

As shown, the aluminum oxide 204 deposits over the surface of the substrate 201 including on a top of the patterned photoresist 202, and onto the surface of the substrate 201 where the photoresist has been removed (areas 203 in FIG. 2b) during the photoresist 202 patterning.

Importantly, since the photoresist 202 is purposely much thicker than the deposited layer on aluminum oxide 204, the deposited thin-film layer of aluminum oxide 204 will not be continuous over the surface and will in fact exhibit non-continuity at the edges of the open areas 203 in the photoresist 202 as shown in FIG. 2c. The lack on continuity is important for the lift off process to work properly. Additionally, a negatively-sloped or reentrant sidewall profile in the photoresist will also aid in the lift-off process.

Figure 2D:
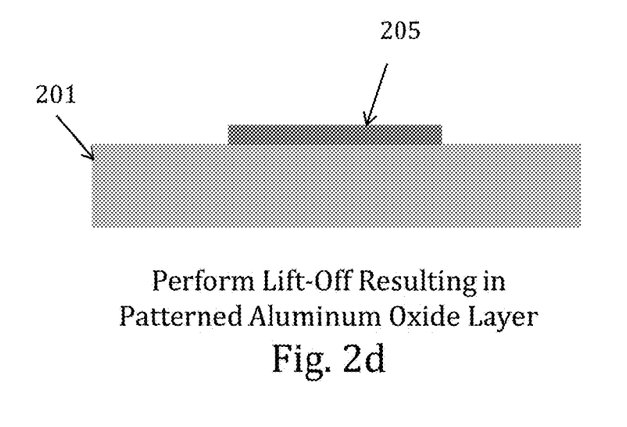

In the next step shown in FIG. 2d, the substrate 201 is immersed into a solvent that dissolves the photoresist 202. This may be acetone, or any other solvent for a specific photoresist type or product. The edges of the photoresist 202 in the areas 203 allow the solvent to reach the photoresist 202 and cause the photoresist 202 to dissolve. The solvent proceeds to dissolve the photoresist 202 laterally undercutting the aluminum oxide layer 204 that is on top of the photoresist 202. As a result, the aluminum oxide 204 deposited on top of the photoresist 202 delaminates and lifts off from the surface of the substrate 201 in the areas where the aluminum oxide 204 was on top of the photoresist 202. Additionally, the aluminum oxide 204 deposited directly on the surface of the substrate 201 in the area 203 is not undercut and remains during the solvent immersion. Once the photoresist 202 is completely removed and the aluminum oxide 204 deposited on top of the photoresist 202 has detached from the substrate 201, the lift off process is completed and results in the successful patterning of the aluminum oxide 205 layer on the substrate 201 as shown in FIG. 2d.

Ultrasonic agitation and/or elevated temperature of the substrate 201 immersed in the solvent can be used to facilitate the removal of the photoresist 202.

The lift-off process is different from the conventional patterning of thin-film material layers by etching techniques. Specifically, lift-off avoids and overcomes the problem with etching aluminum oxide 204 by having a technique that allows the aluminum oxide 204 to be patterned directly and without the use of etching. This is important given the resistance of aluminum oxide 204 to RIE etching techniques.

The patterned aluminum oxide 205 can now be used as a hard masking layer for any reactive ion etching process on a material layer on the substrate or on the substrate itself. It will exhibit a high level of mask selectivity depending on the process chemistry, type of RIE etcher configuration, plasma power, and bias power used, and the mask selectivity can vary from a few hundred-to-one and many thousands-to-one.

The use of the masking layer of aluminum oxide for the etching of a substrate 301 of the present invention is explained in FIG. 3. As in FIGS. 2a-2d, FIGS. 3a-3f shows the substrate 301 in cross section at various stages of the process.

Figure 3A:
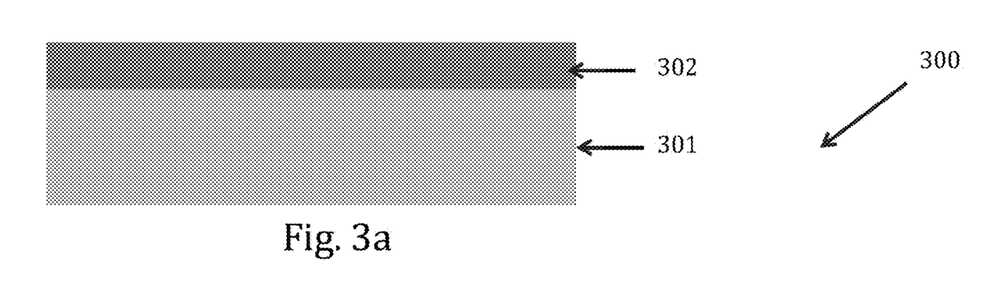
FIGS. 3a-3f illustrate cross-section views of a substrate at various stages of a lift-off process according to another example of the present technology.
Figure 3B:
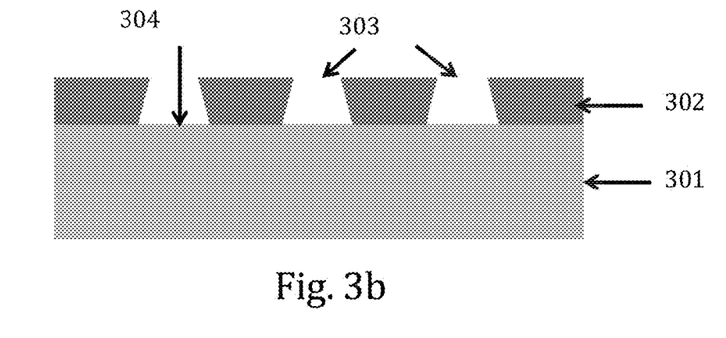

As shown in FIG. 3a, a layer of photoresist 302 is deposited onto a substrate 301. Lithography is then performed on the substrate 301 to expose the photoresist 302, followed by development of the mask design pattern in the photoresist 302 as shown in FIG. 3(b) thereby removing the photoresist from certain areas 303 of the substrate 301 thereby exposing the substrate surface in areas 304 and leaving photoresist 302 in other areas on the substrate 301.

Next, the substrate surface in the areas 304 may be cleaned of any remaining residual photoresist 302 or other chemical residues left in the open areas 304 of the photoresist 302. This cleaning can be immersion into a mild solvent or an exposure to an oxygen $O_2$ plasma. This will facilitate the adhesion of the deposited aluminum oxide 305 material layer to be deposited in the next part of the process.

Figure 3C:
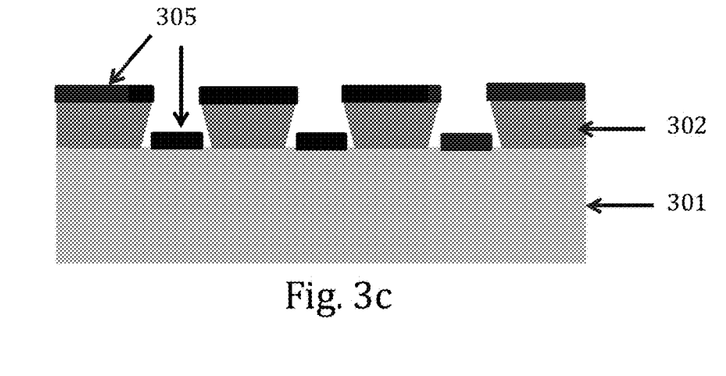

A layer of aluminum oxide 305 is then deposited using physical vapor deposition (PVD), either sputtering or evaporation or a combined of both, onto the surface of the substrate 301 as shown in FIG. 3c. The aluminum oxide 305 is deposited onto the layer of photoresist 302 where the photoresist 302 still exists after the photolithographic patterning that was previously performed as well as onto the cleared areas 304 of the substrate 301 where the photoresist 302 was removed.

Figure 3D:
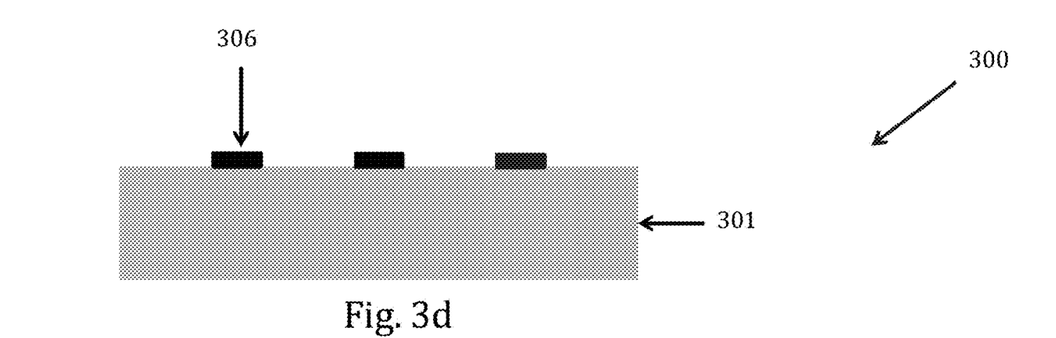

The deposited aluminum oxide layer 305 is then patterned using lift-off whereby the substrate 301 is immersed into a suitable solvent solution. The patterned photoresist 302 on the substrate 301 dissolves in the solvent solution thereby resulting in the aluminum oxide 305 layer that is on top of the photoresist 302 to delaminate from the surface of the substrate 301 thereby lifting off the aluminum oxide 305 deposited onto the photoresist 302. The deposited aluminum oxide 305 depositing directly onto the surface (e.g., in the areas 304) of the substrate 301 does not lift off during this immersion in a solvent. The resultant cross section of the substrate 301 at this point in the process is shown in FIG. 3(d) where the now patterned aluminum oxide 306 is left on selected regions of the surface (e.g., in the areas 304) of the substrate 301.

Figure 3E:
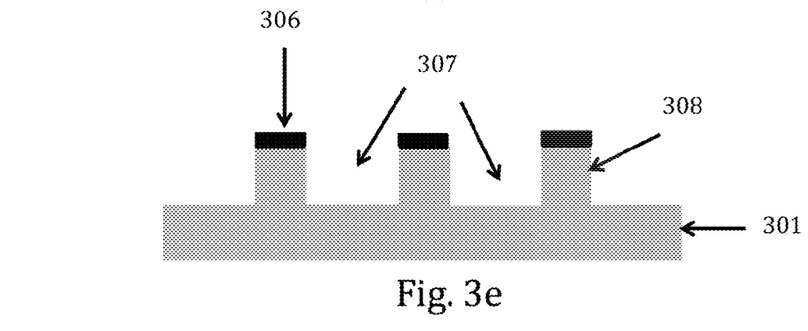

The deposited and patterned aluminum oxide 306 layer acts as a hard mask for the etching of the substrate 301. The etching performed is of the general type called reactive ion etching (RIE) or dry plasma etching. After the deep etching process has been completed to the depth desired as shown in FIG. 3e, the etching process is terminated.

At that point in the process, the aluminum oxide masking layer 306 will usually be removed. As noted, the aluminum oxide 306 is a difficult material to etch and therefore a method is needed that will easily remove the aluminum oxide 306 while also not causing damage to the substrate 301, or any devices, components, or structures that may be made in the substrate 301.

Figure 3F:
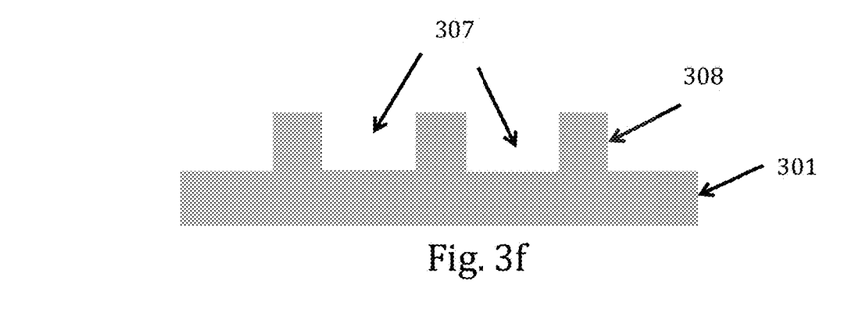

The aluminum oxide is removed by a simple immersion in sodium hydroxide (NaOH) or similar chemical solution. One candidate solution commonly available in micro- and nanofabrication facilities and foundries is photoresist developer solutions. Most of these solutions contain sodium hydroxide as an active agent. The result of the removal of the aluminum oxide masking layer 306 is shown in FIG. 3(f).

Another embodiment of the present disclosure is shown in FIGS. 4a-4f. As before, the substrate 401 at various stages in the process are shown in cross section.

Figure 4A:
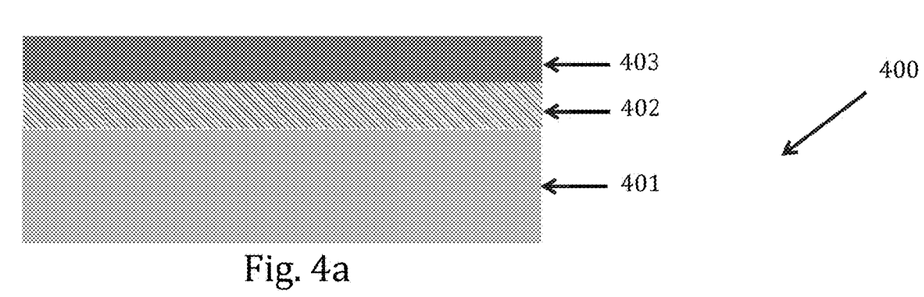
FIGS. 4a-4f illustrate cross-section views of a substrate at various stages of a lift-off process according to another example of the present technology.

In the case of FIGS. 4a-4f, the starting substrate 401 has a material layer 402 on the surface of the substrate 401 that is to be etched. As shown in FIG. 4a, a photoresist layer 403 is deposited onto the surface of the material layer 402 on the substrate 401.

Figure 4B:
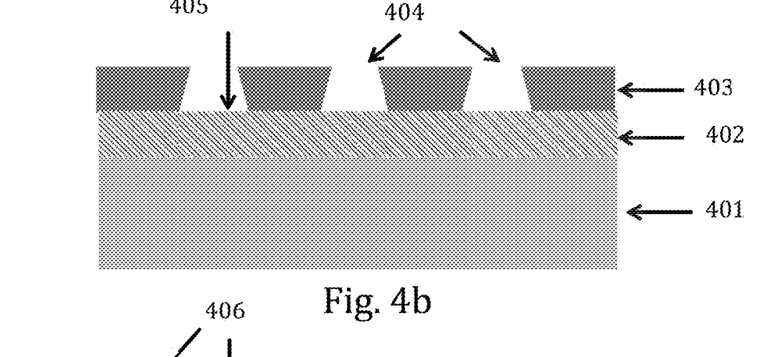

The photoresist layer 403 is then exposed and developed using lithography and once developed, the photoresist layer 403 has been patterned as shown in FIG. 4b where open regions (e.g., patterning 404) are shown in the photoresist layer 403 exposing the surface of the material layer in certain areas 405. A cleaning of the surface (corresponding to the areas 405) of the material layer 402 may be performed using either a chemical immersion in a solvent or an oxygen $O_2$ plasma to facilitate the adhesion of the aluminum oxide 406 to be deposited next in the process.

Figure 4C:
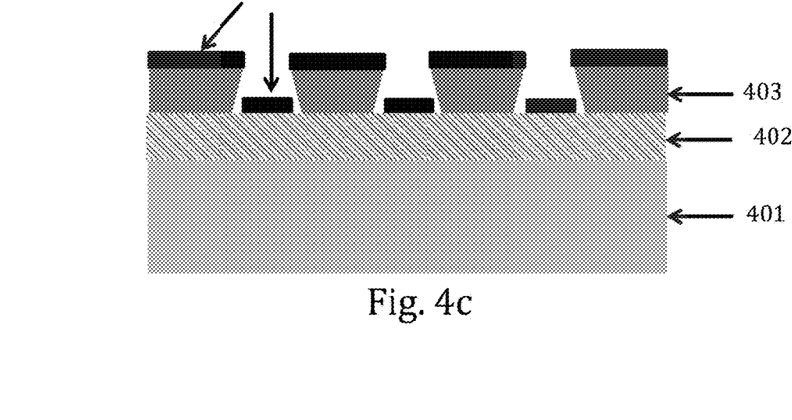

A layer of aluminum oxide 406 is then deposited as shown in FIG. 4c. The deposited aluminum oxide 406 is deposited onto the photoresist layer 403 where it exists as well as directly onto the material layer 402 where the photoresist has been removed through patterning 404 and onto the surface 405 of the material layer 402.

Figure 4D:
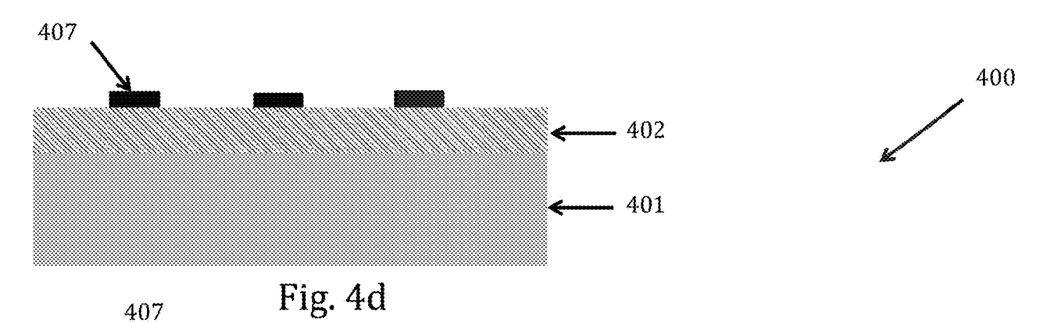

After the aluminum oxide layer 406 has been deposited, the lift-off process is performed where the substrate 401 is immersed into a suitable solvent of the photoresist layer 403. The photoresist layer 403 dissolves in the solvent causing the aluminum oxide 406 to separate from the material layer surface where photoresist layer 403 was present. The aluminum oxide 406 that was deposited directly onto the material layer 402 surface 405 is left intact and patterned 407 as shown in FIG. 4*d*.

Figure 4E:
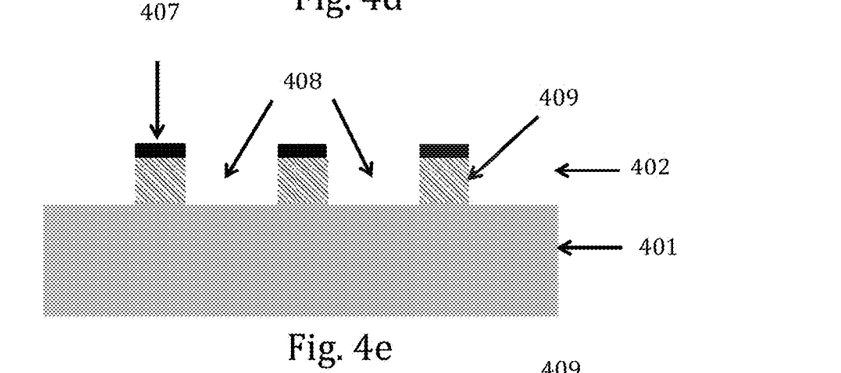

The patterned aluminum oxide 407 layer on the material layer 402 is used as a hard mask layer for the etch to be performed on the material layer 402. The result of the etching of the material layer is shown in FIG. 4(*e*) where it is illustrated that the etch was completed through the material layer 402. Of course, the etch into the material layer 402 could be through the entire thickness of the material layer 402 or a portion of the thickness of the material layer 402.

Figure 4F:
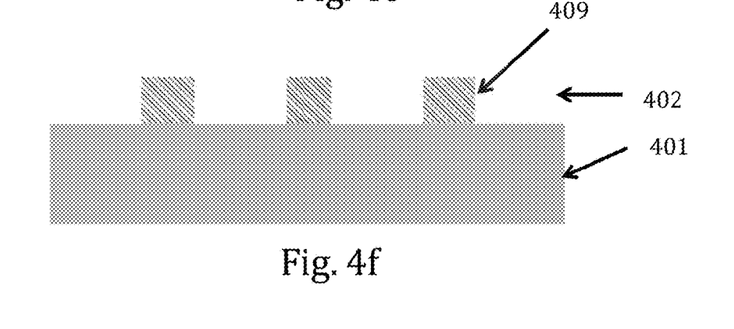

Lastly, in FIG. 4*f* the masking layer of aluminum oxide 407 is removed by immersing the substrate into a solution of sodium hydroxide (NaOH) or similar wet etchant of aluminum oxide 407. The result is that the material layer 402 has been successfully patterned using the aluminum oxide 407 hard mask.

It can be fully understand and appreciated that variations of this process are conveyed by this disclosure and are therefore covered by this invention.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed:

1. A method for depositing, patterning, and removing a layer of aluminum oxide as a masking material layer for performing a reactive ion etching (RIE), the method comprising:

depositing a layer of first layer of photoresist onto a substrate surface of a substrate;

performing a lithography processing step on the first layer of photoresist by aligning a mask design to either pre-existing features made on the substrate surface or to attributes of the substrate, followed by exposure of the first layer of photoresist to transfer the desired shapes and dimensions of the features into the first layer of photoresist;

developing the first layer of photoresist thus patterning the first layer of photoresist into the desired shapes and dimensions of the mask design into the first layer of photoresist;

cleaning exposed regions of the substrate surface of any residual photoresist not removed during development;

depositing a second thin-film layer of aluminum oxide onto the exposed regions of the substrate surface and the patterned first layer of photoresist wherein the second layer of thin-film layer of aluminum oxide has a thickness less than the thickness of the first layer of photoresist;

immersing the substrate into a solvent solution that dissolves the first layer of photoresist on the substrate thus causing the second layer of aluminum oxide positioned on top of the first layer of photoresist lift-off or be released from the substrate thereby leaving a patterned second layer of aluminum oxide layer on the substrate surface where no first layer of photoresist was present;

performing a reactive ion etching on the exposed positions of the substrate surface to a pre-determined depth into the substrate surface wherein the patterned second layer of aluminum oxide functions as a protective hard masking material layer on the substrate surface preventing etching from occurring where the patterned second layer of aluminum oxide is present; and removing the second layer of aluminum oxide by immersion in a sodium hydroxide containing solution.

2. The method of claim 1 wherein the photoresist has negative or positive polarity.

3. The method of claim 1 wherein photolithography, e-beam lithography, direct-write laser lithography, or extreme ultra-violent (EUV) lithography is used to expose the photoresist layer.

4. The method of claim 1 wherein the aluminum oxide layer is deposited using physical vapor deposition (PVD).

5. The method of claim 4 wherein the method of deposition is sputtering.

6. The method of claim 4 wherein the method of deposition is evaporation.

7. The method of claim 4 wherein the aluminum oxide layer is deposited using a reactive deposition process.

8. The method of claim 1 wherein the patterned photoresist has a re-entrant sidewall profile.

9. The method of claim 1 wherein the solution used for removing the aluminum oxide masking layer after the etching is photoresist developer solution.

10. The method of claim 1 wherein the reactive ion etching technique used is deep reactive ion etching (DRIE).

11. The method of claim 1 wherein the reactive ion etching technique used is inductively-coupled plasma (ICP) etching.

12. The method of claim 1 wherein the reactive ion etching used is electron cyclotron resonance (ECR) etching.

13. The method of claim 1 wherein the photoresist removal is facilitated by the use of a photoresist solvent combined with ultra-sonic agitation.

14. The method of claim 1 wherein the photoresist removal is facilitated by the use of a photoresist solvent at an elevated temperature.

15. A method for depositing, patterning, and removing a layer of aluminum oxide as a masking material layer for performing reactive ion etching (RIE) into a material layer on a substrate, the method comprising:

depositing a layer of first layer of photoresist onto a surface of a second material layer on top of the subtrate;

performing a lithography processing step on the first layer of photoresist by aligning a mask design to either pre-existing features made in the second material layer or to attributes of the substrate, followed by exposure of the first layer of photoresist to transfer the desired shapes and dimensions of the features into the first layer of the photoresist;

developing the first layer of photoresist thus patterning the first layer of photoresist into the desired shapes and dimensions of the mask design into the first layer of photoresist;

cleaning exposed regions of the second material layer of any residual photoresist that was not removed during development;

depositing a third thin-film layer of thin-film layer of aluminum oxide onto the exposed regions of the second material layer and the patterned first layer of photoresist wherein the third layer of aluminum oxide has a thickness less than the thickness of the first layer of photoresist;

immersing the substrate into a solvent solution that dissolves the first layer of photoresists on the substrate thus causing the third layer of aluminum oxide positioned on top of the first layer of photoresists to lift-off or be released from the surface of the second material layer thereby leaving the patterned third layer of aluminum oxide layer on the surface of the second material layer only on areas on the surface of the second material layer that no first layer of photoresist was present;

performing a reactive ion etching (RIE) on exposed portions of the surface of the second material layer to a predetermined depth into the second material layer wherein the patterned third layer of aluminum oxide functions as a protective masking material layer on the surface of the second material layer preventing etching from occurring where the patterned third layer of aluminum oxide is present; and removing the third layer of aluminum oxide by immersion in a sodium hydroxide containing solution.

* * * * *